United States Patent [19]

Weresch

[11] 4,142,347

[45] Mar. 6, 1979

[54] APPARATUS FOR MOUNTING ELECTRICAL COMPONENTS HAVING TWO ALIGNED CONNECTION WIRES ON A BELT

[76] Inventor: Thomas Weresch, Greschbachstrasse 19,, D-7500 Karlsruhe 41, Fed. Rep. of Germany

[21] Appl. No.: 786,773

[22] Filed: Apr. 12, 1977

[30] Foreign Application Priority Data

Apr. 27, 1976 [DE] Fed. Rep. of Germany ....... 2618383

[51] Int. Cl.² .............................................. B65B 27/10
[52] U.S. Cl. .......................................... 53/591; 53/594
[58] Field of Search ............. 53/180 R, 182 R, 198 R, 53/200; 156/552, 555

[56] References Cited

U.S. PATENT DOCUMENTS

| | | | |
|---|---|---|---|
| 2,880,560 | 4/1959 | Gibson | 53/198 R X |
| 2,885,849 | 5/1959 | Wohlman, Jr. | 53/198 R |
| 3,073,446 | 1/1963 | Wilson et al. | 140/147 X |
| 3,669,309 | 6/1972 | Romeo | 53/198 R X |
| 3,701,233 | 10/1972 | Luckman, Jr. | 53/198 R |
| 3,707,425 | 12/1972 | Jamal | 156/552 X |
| 3,775,939 | 12/1973 | Elsner et al. | 53/198 R |
| 4,021,289 | 5/1977 | Orzeler et al. | 53/198 R X |

*Primary Examiner*—John Sipos
*Attorney, Agent, or Firm*—Craig & Antonelli

[57] ABSTRACT

In an apparatus for mounting electrical components having connecting wires extending outwardly from opposite ends thereof in a belt by locating each such wire between a respective pair of superimposed bands, the toothed, transport wheels and rollers to which the bands are fed and at which such bands are combined with the wires interposed therebetween are axially adjustable to provide for the ready use of the apparatus in the context of components of a range of dimensions, the tape-feed arrangements similarly being adjustable to maintain their alignment with a respective roller.

13 Claims, 3 Drawing Figures

APPARATUS FOR MOUNTING ELECTRICAL COMPONENTS HAVING TWO ALIGNED CONNECTION WIRES ON A BELT

The invention relates to an apparatus for applying electrical components having two aligned connection wires to a belt formed from two adhesive bands between which the ends of the connection wires are located, the adhesive bands being wound on a supply bobbin, the apparatus consisting of at least two toothed wheels arranged next to each other and which receive the electrical components in aligned tooth gaps therein and two rollers adjacent such toothed wheels each to support a respective adhesive band and a second adhesive band in superimposed disposition relative thereto, there being a pressing device pressing on the superimposed bands with the connection wires interposed therebetween.

Such arrangements are known and used for making belts of such electrical components as resistances, condensers and diodes which are led to the apparatus by means of a separate guide. At the end of the guide they are located in the toothed transport wheels by engagement of the connection wires of the components with tooth gaps in such toothed wheels. The toothed wheels are arranged on a common shaft with the rollers and are located at a fixed, predetermined distance from such rollers. The rollers are disposed outwardly of the toothed transport wheels. An adhesive band fed from a supply bobbin thereof is guided around each roller meeting such roller generally tangentially, which adhesive band is advanced by the roller. The ends of the connection wires of the electrical components lie on these two adhesive bands. From two other supply bobbins further adhesive bands are guided to a pressing device associated with each roller, the adhesive side of each such further band overlying and being pressed into contact with the respective first adhesive band. In this way the ends of the connection wires of the components are firmly fixed between the two adhesive bands present on each roller.

This known apparatus has the drawback that with the use of electrical components of different size the supply bobbins which provide the adhesive bands must be adjusted separately at each side of the electrical component so that such bands will be disposed in overlapped relationship with the connection wires located therebetween. In addition, the fact that the width of the rollers must be adapted to accommodate the largest and shortest lengths of the connection wires of the components to be processed and the distance of the two rollers from one another must be adapted to the length of the largest body of the components. There thus results the drawback that for making into belts such components which have a minimum length from the two ends of the connection wires, after having processed components having the maximum body length, an exchanging of the whole shaft carrying the toothed transport wheels and the rollers for another adapted to the smaller components is necessary. The exchanging and adjusting of the supply bobbins is tedious and requires, at least with this apparatus, skilled personnel, so that the adjustment of the machine cannot be carried out by unskilled labour.

The invention is based on the problem of designing an apparatus of the above mentioned type such that it can be erected rapidly by unskilled labour and simply according to the components to be used.

This problem is solved, according to the invention, in that the toothed transport wheels and the rollers are disposed variable in distance on a common shaft and the two supply bobbins for the two adhesive bands to be connected to one another are fixed on a carrier and the two carriers are adjustable in respect of one another in the direction of the axis of the shaft.

With the constructional apparatus according to the invention therefore all sizes of electrical components can be accommodated without exchanging the shaft with the toothed transport wheels and the rollers, and the two supply bobbins for the adhesive bands each fixed on a carrier are adjusted by simple adjustment of the carrier according to the respective component without the two adhesive bands losing at the end of the constructional elements their position covering one another upon operation of the apparatus. Adjustment of each individual supply bobbin as is required in the prior art is dispensed with. Thus the apparatus of the invention may be adjusted rapidly and easily using unskilled labour.

According to a preferred embodiment each carrier is formed from two carrier parts arranged at right angles to one another and there is arranged on each end of these carrier parts the supply bobbins, one of the adhesive bands of each carrier being led approximately tangentially to the roller, whilst the other adhesive band is guided in the same direction as the first adhesive band by the pressing device at a somewhat over-obtuse angle.

In order to facilitate the insertion of the adhesive bands, it is further provided that the pressing device has a lever with a pressure roller arranged on its end which pressure roller is pivotably hinged on the carrier. In an advantageous further construction of the invention there is linked to the hinge point of the first lever a second lever on the end of which is disposed a second guide roller and the second lever fits detachably in the pressing position by means of a handle and a spring is disposed between the two levers. The force of the spring is suitably adjustable.

The invention will now be described further, by way of example only, with reference to the accompanying drawings illustrating one embodiment thereof and in which.

Figure 1:
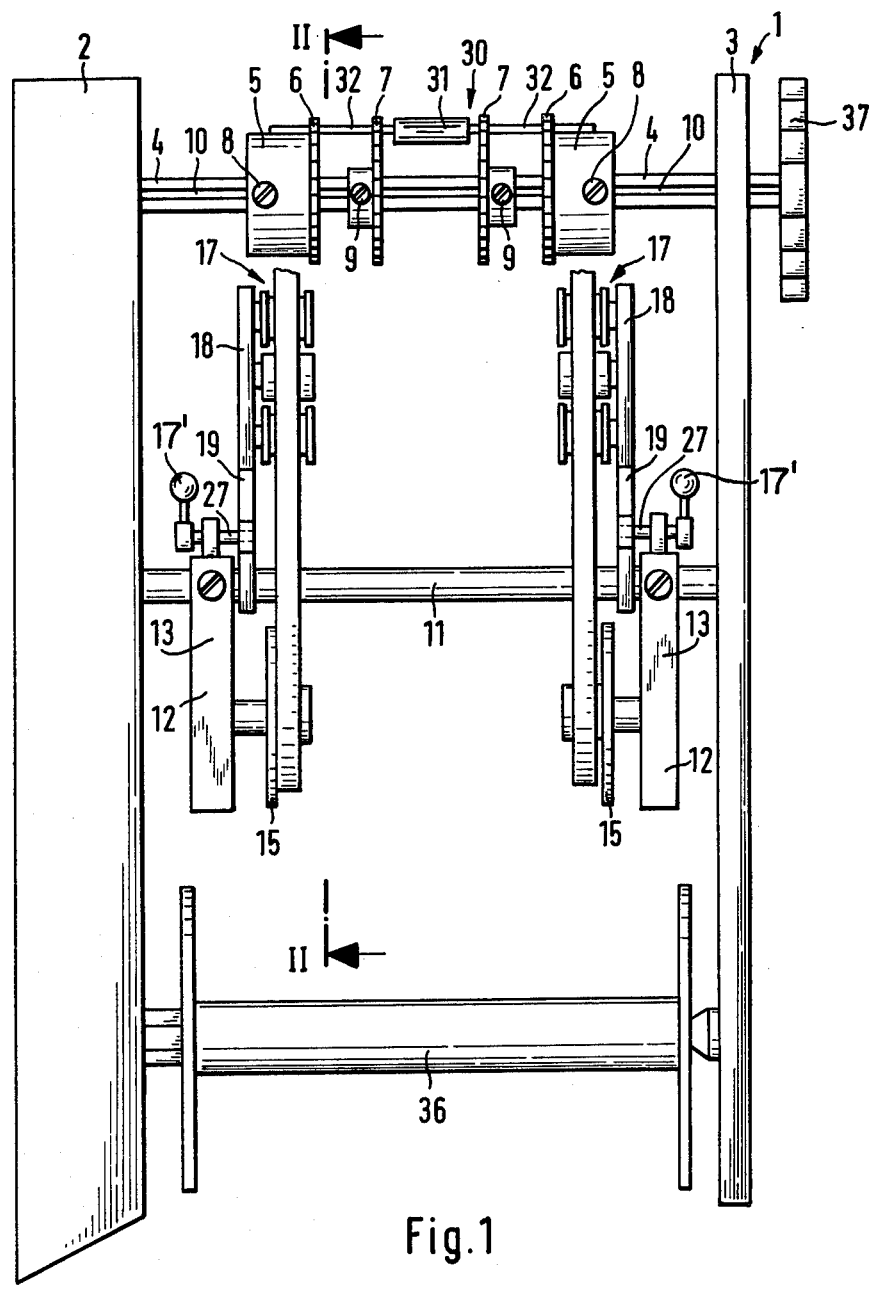
FIG. 1 is a front elevation of apparatus constructed in accordance with the invention, parts of the apparatus being omitted in the interests of clarity.

The apparatus indicated generally in FIG. 1 by the reference numeral 1, includes an engine and gear box 2 at one side thereof, whilst the opposite side of the apparatus comprises a housing plate 3. A shaft 4 is rotatably mounted in the box 2 and the housing plate 3, shaft 4 being driven by means of a motor (not shown) located within box 2.

Two rollers 5 are provided in spaced apart disposition on and secured to the shaft 4, the inwardly facing ends of the rollers being formed with respective toothed flanges having teeth 6 thereon, the teeth 6 on the respective flanges being in alignment in the axial direction of the shaft. Between the rollers 5, the shaft 4 further carries two toothed, transport wheels 7, the wheels 7 being secured to the shaft by screws 9 which engage an axial groove 10 in the shaft, such groove likewise receiving screws 8 whereby the rollers 5 are secured to the shaft for rotation therewith. As will readily be appreciated, the rollers 5 and the transport wheels 7 are adjustable axially of the shaft 4. A frame rod 11 is provided beneath the shaft 4, such rod 11 being carried by and extending between the gear box 2 and the housing plate 3. Two carrier arms 12 are mounted on the frame rod 11 for adjustment axially thereof. Each carrier arm 12 is of L-shape when viewed in side elevation, the end of each limb 13, 14 thereof carrying a respective supply bobbin 15, 16 wound with an adhesive band (the rear supply bobbin 16 is for reason of visibility not shown in FIG. 1). At the junction of the limbs 13, 14 of each carrier arm 12 there is provided a pressing device 17 which is lockable in the "load" position shown in FIG. 2 by means of a locking lever 17' which pressing device can be hinged forwardly from the position shown in FIG. 2 to that as shown in FIG. 1, for insertion of the adhesive bands.

Each pressing device 17 consists of two levers 18, 19 pivotably mounted on the carrier 12, each such lever 18, 19 having a respective guide roller 20, 21 at its remote end for guiding the adhesive band 29. A pressure roller 22 is provided on lever 18 and below guide roller 20, there being an adjustable spring means comprising a spring 23 and an adjusting device 24 extending between and supported by levers 18, 19 for varying the loading applied to lever 18, and hence to pressure roller 22, (the adjusting device 24 is omitted in FIG. 1 for the sake of visibility). That end of lever 19 hinged on the carrier 12 has a nose piece 25 having a flat underside portion 26 which, in the pressing position as shown in FIG. 2, bears on an arresting pin 27 of the release device of the pressing device 17 fixed on the frame 12.

Figure 2:
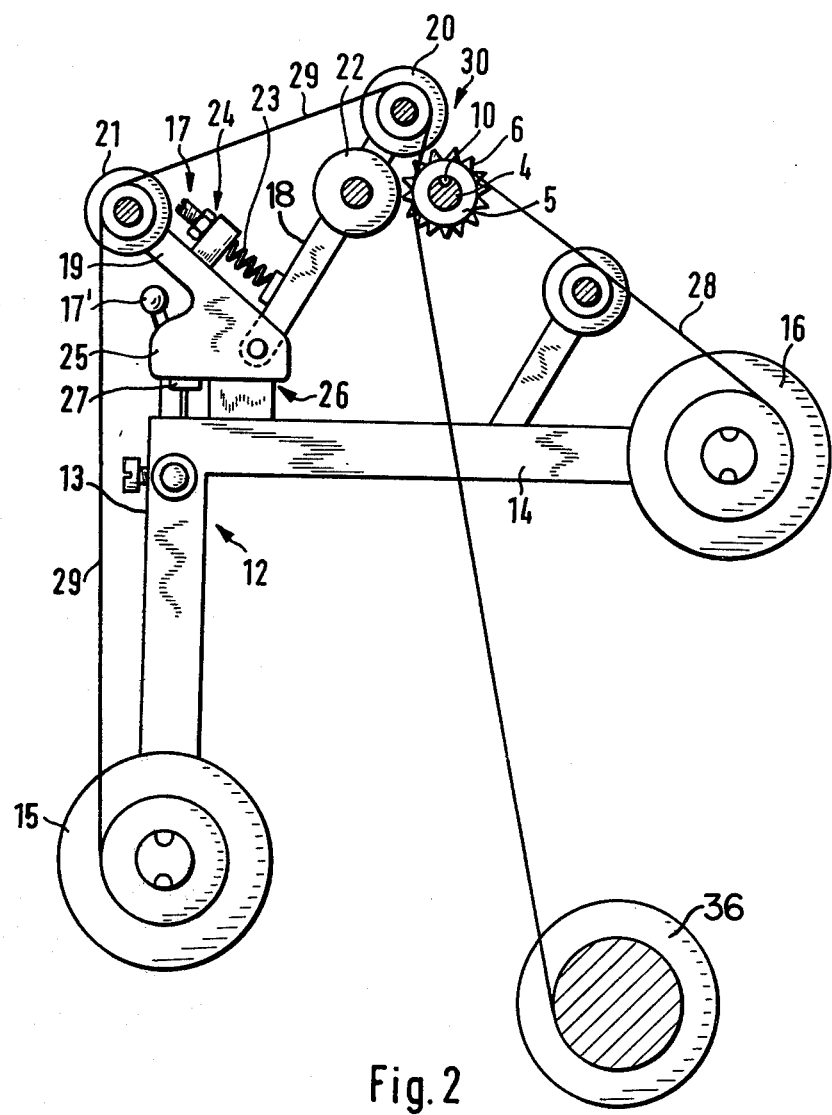
FIG. 2 is a section on line II—II of FIG. 1.
Figure 3:
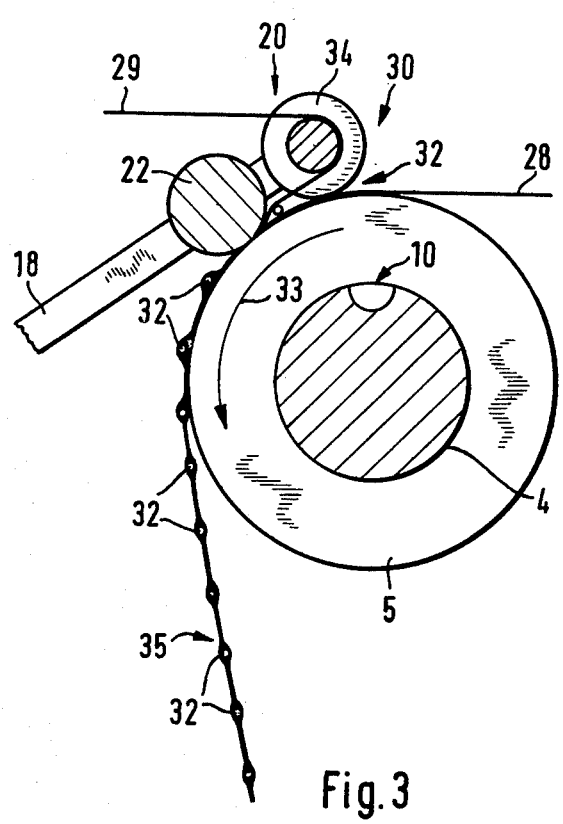
FIG. 3 is a section through the pressing device and a roller of FIGS. 1 and 2, but drawn to a larger scale.

The apparatus 1 is made ready for operation in that, with the pressing device 17 in the retracted position shown in FIG. 1, the band 28 of the supply bobbin 16 is placed on the roller 5, whilst the adhesive band 29 of the other supply bobbin 15 is looped around guide rollers 20, 21 of the pressure device 17 and also around pressure roller 22, whereupon the pressing device 17 is moved into the operative position shown in FIG. 2 and is locked in such position by means of the handle 17' and the arresting pin 27. By virtue of spring 23, lever 18 is resiliently loaded in a clockwork direction, (FIG. 2), and thus pressing roller 22 is spring-loaded into contact with roller 5. If the components 31 are fed to the device 1 in the direction of the arrow 30, (FIG. 3), with their connection wires 32 engaged with aligned tooth gaps of the transport wheels 7 and of the lateral teeth 6 of the roller 5, the ends of the connection wires 32, on rotation of the shaft 4, are moved in the direction of the arrow 33 and onto the adhesive band 28 at a position in advance of the pressure roller 22. The guide roller 20 has a peripheral groove 34 therein to receive the adhesive band 29 and to locate such band in alignment with the other adhesive band 28. Upon further rotation of the roller 5, the adhesive band 29 is pressed into contact with the other adhesive band 28 by means of the pressure roller 22, the ends of the connection wires 32 thereby being stuck between the two superimposed and mutually adhering bands 28, 29. The resultant belt 35, that is to say, the superimposed bands 28, 29 and the components 31 secured thereto, may proceed directly to some further processing operation, for example, cut and packed into pre-selected lengths, or may be wound onto a winding bobbin 36 (FIG. 1) mounted between the housing plate 3 and the motor and gear box 2 and driven therefrom via a slip clutch (not shown).

For adjustment of the packing density, that is the distance between the electrical components on the belt, a cam disc 37 (FIG. 1) mounted on shaft 4 outwardly of the housing plate 3 and which controls, via a control cam (not shown), the delivery of the components to the apparatus may be exchanged for another having a different number of cams. Hereby in a simple manner the packing density of the components to be formed into a belt can be adjusted.

What I claim is:

1. An apparatus for applying electrical components having two aligned connection wires between a plurality of pairs of adhesive bands between a respective pair of which a respective connection wire is located to form a belt having components arranged in spaced disposition longitudinally thereof, each of the adhesive bands being wound on supply bobbins, a respective pair of supply bobbins being provided for each of said pairs of adhesive bands, such apparatus comprising two sets of at least two separate toothed transport wheels arranged next to one another to receive the electrical components in tooth gaps therein, a roller adjacent one of said transport wheels of each set to support a respective adhesive band, and a pressing device for applying a second adhesive band to each first mentioned band in superimposed disposition thereon, characterised in the provision of means mounting the toothed transport wheels and the rollers in an axially adjustable manner on a first common shaft, said first shaft being supported at each end by a respective supporting member, means fixing each respective pair of supply bobbins for the adhesive bands which are to be superimposed on a respective carrier and means for mounting the carriers between said supporting members on a second common shaft in an adjustable manner with respect to one another in their axial direction, said second common shaft being supported at its ends by said supporting members, and said first shaft being mounted independent of said common carriers.

2. An apparatus according to claim 1, characterised in that each carrier is formed from two carrier parts arranged at right angles to one another such that on each end of the carrier parts the supply bobbins are arranged and in that one of the adhesive bands of each carrier is led approximately tangentially to the roller, the other adhesive band being guided by the pressing device at a somewhat over-obtuse angle in the same direction as the first adhesive band.

3. An apparatus according to claim 1, characterised in that the pressing device has a pressure roller arranged on an outwardly pivotal, spring-loaded lever.

4. An apparatus according to claim 3, characterised in that the said lever further carries a guide roller at the end thereof.

5. An apparatus as claimed in claim 2, characterised in that the pressing device has a pressure roller arranged on an outwardly pivotal, spring-loaded lever.

6. An apparatus as claimed in claim 5, characterised in that the said lever further carries a guide roller at the end thereof.

7. An apparatus according to claim 1, characterised in that on the said first shaft and outwardly of a housing plate in which one end of such shaft is rotatably mounted an exchangeable cam disc is fixed which, via a control cam, controls a feed device for the electrical components.

8. An apparatus for applying electrical components having two aligned connection wires between a plurality of pairs of adhesive bands between a respective pair of which a respective connection wire is located to form a belt having components arranged in spaced disposition longitudinally thereof, each of the adhesive bands being wound on supply bobbins, a respective pair of supply bobbins being provided for each of said pairs of adhesive bands, such apparatus comprising two sets of at least two toothed transport wheels arranged next to one another to receive the electrical components in tooth gaps therein, a roller adjacent one of said transport wheels of each set to support a respective adhesive band, and a pressing device for applying a second adhesive band to each first mentioned band in superimposed disposition thereon, characterised in the provision of means mounting the toothed transport wheels and the rollers in an axial adjustable manner on a first common shaft, means fixing each respective pair of supply bobbins for the adhesive bands which are to be superimposed on a respective carrier and means for mounting the carriers on a second common shaft in an adjustable manner with respect to one another in their axial direction, characterised in that the pressing device has a pressure roller arranged on an outwardly pivotal, spring-loaded lever, and characterised in that on the hinge point of the said lever there is linked a second lever on the end of which is arranged a second guide roller.

9. An apparatus according to claim 8, characterised in that the second lever is lockable in the pressing position by means of a handle, there being a spring disposed between the two levers.

10. An apparatus according to claim 9, characterised in that the loading applied by the spring is adjustable.

11. An apparatus for applying electrical components having two aligned connection wires between a plurality of pairs of adhesive bands between a respective pair of which a respective connection wire is located to form a belt having components arranged in spaced disposition longitudinally thereof, each of the adhesive bands being wound on supply bobbins, a respective pair of supply bobbins being provided for each of said pairs of adhesive bands, such apparatus comprising two sets of at least two toothed transport wheels arranged next to one another to receive the electrical components in tooth gaps therein, a roller adjacent one of said transport wheels of each set to support a respective adhesive band, and a pressing device for applying a second adhesive band to each first mentioned band in superimposed disposition thereon, characterised in the provision of means mounting the toothed transport wheels and the rollers in an axial adjustable manner on a first common shaft, means fixing each respective pair of supply bobbins for the adhesive bands which are to be superimposed on a respective carrier and means for mounting the carriers on a second common shaft in an adjustable manner with respect to one another in their axial direction, characterised in that each carrier is formed from two carrier parts arranged at right angles to one another such that on each end of the carrier parts the supply bobbins are arranged and in that one of the adhesive bands of each carrier is led approximately tangentially to the roller, the other adhesive band being guided by the pressing device at a somewhat over-obtuse angle in the same direction as the first adhesive band, characterised in that the pressing device has a pressure roller arranged on an outwardly pivotal, spring-loaded lever, characterised in that the said lever further carries a guide roller at the end thereof, and further characterised in that on the hinge point of the said lever there is linked a second lever on the end of which is arranged a second guide roller.

12. An apparatus as claimed in claim 11, characterised in that the second lever is lockable in the pressing position by means of a handle, there being a spring disposed between the two levers.

13. An apparatus as claimed in claim 12, characterised in that the loading applied by the spring is adjustable.

* * * * *